(12) United States Patent
Tanaka et al.

(10) Patent No.: US 9,093,397 B2
(45) Date of Patent: Jul. 28, 2015

(54) FLEXIBLE DEVICE MANUFACTURING METHOD AND FLEXIBLE DEVICE

(75) Inventors: Yuji Tanaka, Osaka (JP); Kenji Okumoto, Osaka (JP)

(73) Assignee: PANASONIC CORPORATION, Osaka (JP)

(*) Notice: Subject to any disclaimer, the term of this patent is extended or adjusted under 35 U.S.C. 154(b) by 0 days.

(21) Appl. No.: 14/115,167

(22) PCT Filed: Jul. 6, 2011

(86) PCT No.: PCT/JP2011/003864
§ 371 (c)(1),
(2), (4) Date: Nov. 1, 2013

(87) PCT Pub. No.: WO2013/005254
PCT Pub. Date: Jan. 10, 2013

(65) Prior Publication Data
US 2014/0070203 A1   Mar. 13, 2014

(51) Int. Cl.
*H01L 51/00* (2006.01)
*H01L 27/32* (2006.01)
(Continued)

(52) U.S. Cl.
CPC ............ *H01L 27/32* (2013.01); *H01L 27/1266* (2013.01); *H01L 51/003* (2013.01); *H01L 51/0097* (2013.01); *H05B 33/10* (2013.01);
(Continued)

(58) Field of Classification Search
CPC . H01L 27/1214; H01L 27/1266; H01L 27/12; G02F 2001/13613
USPC ................... 257/E21.111, E21.568, E21.499, 257/E33.06; 438/458, 118, 149
See application file for complete search history.

(56) References Cited

U.S. PATENT DOCUMENTS

| 5,443,922 A | 8/1995 | Nishizaki et al. |
| 6,700,631 B1 | 3/2004 | Inoue et al. |

(Continued)

FOREIGN PATENT DOCUMENTS

| JP | 05-163488 | 6/1993 |
| JP | 11-312811 | 11/1999 |

(Continued)

OTHER PUBLICATIONS

International Search Report, mailed Sep. 20, 2011, in corresponding International Application No. PCT/JP2011/003864.

*Primary Examiner* — David Vu
*Assistant Examiner* — Jonathan Han
(74) *Attorney, Agent, or Firm* — Greenblum & Bernstein, P.L.C.

(57) ABSTRACT

Flexible device manufacturing method including: forming thin film by coating surface of support with predetermined solution in state where hydroxyl groups are present on surface; forming releasing layer by baking thin film; forming flexible substrate on releasing layer; forming device on flexible substrate; and releasing releasing layer, flexible substrate and device from support at interface between support and releasing layer. Predetermined solution contains alkylsilane alkoxide derivative and titanium alkoxide derivative. Baking temperature for baking thin film is at least 200° C. and at most 350° C. Ratio of number of silicon atoms in alkylsilane alkoxide derivative to number of titanium atoms in titanium alkoxide derivative is 3.3:1 to 4.1:1 when baking temperature is at least 200° C. and less than 270° C., 3.3:1 to 23:1 when baking temperature is at least 270° C. and at most 330° C., and 19:1 to 23:1 when baking temperature is more than 330° C. and at most 350° C.

11 Claims, 9 Drawing Sheets

(51) Int. Cl.
*H01L 27/12* (2006.01)
*H05B 33/10* (2006.01)
*H01L 51/52* (2006.01)

(52) U.S. Cl.
CPC ....... *H01L 51/5218* (2013.01); *H01L 2227/326* (2013.01); *H01L 2251/5338* (2013.01); *Y02E 10/549* (2013.01)

(56) References Cited

U.S. PATENT DOCUMENTS

| | | | |
|---|---|---|---|
| 2003/0008437 A1 | 1/2003 | Inoue et al. | |
| 2003/0032210 A1 | 2/2003 | Takayama et al. | |
| 2007/0275255 A1* | 11/2007 | Ooms et al. | 428/447 |
| 2007/0295973 A1* | 12/2007 | Jinbo et al. | 257/88 |
| 2009/0239320 A1* | 9/2009 | Takayama et al. | 438/27 |
| 2010/0068483 A1 | 3/2010 | Leu et al. | |
| 2010/0143708 A1 | 6/2010 | Liao et al. | |
| 2012/0201961 A1 | 8/2012 | Liao et al. | |
| 2013/0214324 A1 | 8/2013 | Takayama et al. | |

FOREIGN PATENT DOCUMENTS

| | | |
|---|---|---|
| JP | 2003-174153 | 6/2003 |
| JP | 2003-297443 | 10/2003 |
| JP | 2006-203220 | 8/2006 |
| JP | 2007-523225 | 8/2007 |
| JP | 2007-266593 | 10/2007 |
| JP | 2008-150419 | 7/2008 |
| JP | 2010-067957 | 3/2010 |
| JP | 2010-111853 | 5/2010 |
| WO | 2005/063890 | 7/2005 |

* cited by examiner

FIG. 1

| Releasing layer | | Coatability | Contactness | Releasability | High temp resistance | Chemical resistance | Transparency |
|---|---|---|---|---|---|---|---|
| None | | — | ○ | × | ○ | ○ | ○ |
| Parylene (conventional) | | × | × | ○ | ○ | ○ | ○ |
| COC (conventional) | | ○ | × | ○ | × | △ | ○ |
| SOG | SiO-based | ○ | △ | ○ | ○ | ○ | ○ |
| | TiO-based | ○ | ○ | × | ○ | ○ | ○ |
| | SiO-based+TiO-based | ○* | ○ | ○** | ○ | ○ | ○ |

*TiO-based: 30% coatability ×
(solution is gelled)

**TiO-based: 5-10% releasability ○
20% releasability △

FIG. 4

| Baking temp (°C) | Si ratio (number of Si atoms when number of Ti atoms is 1) | | | | | |
|---|---|---|---|---|---|---|
| | Only Si | 67 | 21 | 13 | 5.9 | 3.7 |
| 200 | A | A | A | A | A | B |
| 250 | A | A | A | A | A | B |
| 270 | — | — | B | — | — | B |
| 300 | A | A | B | B | B | B |
| 330 | — | — | B | — | — | B |
| 350 | A | A | B | C | C | C |

FLEXIBLE DEVICE MANUFACTURING METHOD AND FLEXIBLE DEVICE

TECHNICAL FIELD

The present invention relates to a flexible device manufacturing method and a flexible device.

BACKGROUND ART

In recent years, a flexible display has been expected to be a next-generation display. The flexible display includes devices formed on a flexible substrate, such as an organic EL (Electronic Luminescence) and a TFT (Thin Film Transistor) for the drive circuit.

Meanwhile, the flexible substrate is not stable in shape and low in strength and thus it is not easy to form a device on the flexible substrate. Accordingly, it is underway to develop a method of manufacturing a flexible device by forming a flexible substrate on a support that is made of glass or the like that is stable in shape and high in strength, forming a device on the flexible substrate, and then releasing the flexible substrate and the device together as one unit from the support.

However, this method requires an excellent balance between (i) adhesiveness of the support with the flexible substrate and (ii) releasability of the support from the flexible substrate. That is to say, if the adhesiveness of the support with the flexible substrate is high, the releasability is low. In that case, it requires a strong force to release the flexible substrate from the support, and the strong force applied may break the device on the flexible substrate. On the other hand, if the adhesiveness of the support with the flexible substrate is low, the releasability is high. In that case, it is difficult for the device to be broken by the releasing, but it is difficult to form the device on the flexible substrate since the flexible substrate is not closely contact with the support and is unstable.

As described above, it is difficult to obtain a flexible substrate having, in good balance, both adhesiveness and releasability that are properties contrary to each other. The following documents disclose, as the means to solve the problem, a technology for providing a releasing layer between the support and the flexible substrate.

Patent Literature 1 discloses, as illustrated in FIG. 9A, a structure where a releasing layer composed of two layers is inserted between a support 201 and a flexible substrate 202. More specifically, a nitride layer 203 is formed on the support 201, and on the nitride layer 203, an oxide layer 204, the flexible substrate 202, and a device 205 are laminated in the stated order. The nitride layer 203 and the oxide layer 204 constitute the releasing layer. In this structure, the difference in film stress between the nitride layer 203 and the oxide layer 204 is used to release the oxide layer 204 and the flexible substrate 202 as one unit from the support 201 on which the nitride layer 203 has been formed, the releasing occurring at the interface between the nitride layer 203 and the oxide layer 204. Furthermore, the document discloses heating the interface by irradiating laser thereto, as one example of how to cause the releasing to occur.

Patent Literature 2 discloses, as illustrated in FIG. 9B, a structure where a releasing layer 213 is inserted between a support 211 and a flexible substrate 212, the releasing layer 213 being made of parylene or COC (cyclic olefin copolymer). More specifically, the releasing layer 213 is formed on a central portion of the support 211, but not on an outer circumferential portion of the support 211. The flexible substrate 212 is then formed to cover the releasing layer 213 and the outer circumferential portion of the support 211.

With this structure, the central portion of the support 211 has high releasability due to the releasing layer 213 that is present between the support 211 and the flexible substrate 212, while the outer circumferential portion has high adhesiveness since the support 211 and the flexible substrate 212 are in direct contact with each other without the releasing layer 213 therebetween. In this state, a device 214 is formed on a central portion of the flexible substrate 212. Subsequently, the outer circumferential portions of the support 211 and the flexible substrate 212, where they are in close contact with each other, are cut away. After this, the flexible substrate 212 is released from the support 211 at the interface between the support 211 and the releasing layer 213.

CITATION LIST

Patent Literature

[Patent Literature 1] Japanese Patent Application Publication No. 2006-203220

[Patent Literature 2] Japanese Patent Application Publication No. 2010-67957

SUMMARY OF INVENTION

Technical Problem

However, the above-mentioned conventional technologies have the following problems.

First, according to Patent Literature 1, two layers constituting the releasing layer are formed between the support 201 and the flexible substrate 202, and the support 201 is released from the flexible substrate 202 at the interface between the two layers. A problem of this method is that the process for forming the releasing layer includes many procedures and the load of the process is heavy. Another problem is that the laser irradiation apparatus used for the releasing is expensive, causing a high cost.

Next, according to Patent Literature 2, a gap is generated between the support 211 and the releasing layer 213, which decreases the adhesiveness between the support 211 and the flexible substrate 212. Due to the low adhesiveness, the flexible substrate 212 is unstable when the device 214 is formed on the flexible substrate 212, making it difficult to form the device minutely. The reason for this is as follows. The flexible substrate 212 is generally made of a resin material. Since the resin material contains water, when the flexible substrate 212 is formed, the water contained in the resin material is vaporized to generate gas, and the gas intrudes between the releasing layer 213 and the support 211, which allows a gap to be generated.

Furthermore, the gap between the releasing layer 213 and the support 211 causes another problem. That is to say, when the gap is generated, the flexible substrate 212 formed on the releasing layer 213 becomes uneven and the flatness thereof is lost. In addition, to separate the flexible substrate 212 from the support 211, a procedure is required for cutting the outer circumferential portion of the support 211 and the flexible substrate 212 along the outer circumference of the releasing layer 213, which imposes a load on the device 214. This is a still another problem of this method. Furthermore, the COC, which is the material of the releasing layer 213, has low heat resistance (Tg: 150° C. to 250° C.) and low dimensional stability (CTE: 50 ppm to 100 ppm), thereby restricting the process.

It is therefore an object of the present invention to provide a flexible device manufacturing method for manufacturing a flexible device with a simplified process, and the flexible device.

Solution to Problem

The above object is fulfilled by a flexible device manufacturing method in one aspect of the present invention, comprising: forming a thin film by coating a surface of a support with a predetermined solution in a state where hydroxyl groups are present on the surface; forming a releasing layer by baking the thin film; forming a flexible substrate on the releasing layer; forming a device on the flexible substrate; and releasing the releasing layer, the flexible substrate and the device from the support at an interface between the support and the releasing layer, wherein the predetermined solution contains alkylsilane alkoxide derivative and titanium alkoxide derivative, a baking temperature for baking the thin film in the forming the releasing layer is at least 200° C. and at most 350° C., a ratio of the number of silicon atoms contained in the alkylsilane alkoxide derivative to the number of titanium atoms contained in the titanium alkoxide derivative is in a range from 3.3:1 to 4.1:1 when the baking temperature is at least 200° C. and less than 270° C., the ratio is in a range from 3.3:1 to 23:1 when the baking temperature is at least 270° C. and at most 330° C., and the ratio is in a range from 19:1 to 23:1 when the baking temperature is more than 330° C. and at most 350° C.

Advantageous Effects of Invention

According to the present aspect of the invention, the adhesiveness and releasability between the releasing layer and the support are controlled by adjusting the baking temperature while adjusting a mixture ratio of alkylsilane alkoxide derivative and titanium alkoxide derivative contained in the predetermined solution. This makes it possible to obtain a releasing layer having an excellent balance between releasability and adhesiveness with the support, by forming the releasing layer with a predetermined mixture ratio of alkylsilane alkoxide derivative and titanium alkoxide derivative and with a predetermined baking temperature range.

BRIEF DESCRIPTION OF DRAWINGS

FIG. 1 illustrates results of the study of possible materials of the releasing layer.

FIG. 4 illustrates results of the study of the influence of the mixture ratio and the baking temperature on the releasability.

DESCRIPTION OF EMBODIMENTS

Figures 2A, 2B:
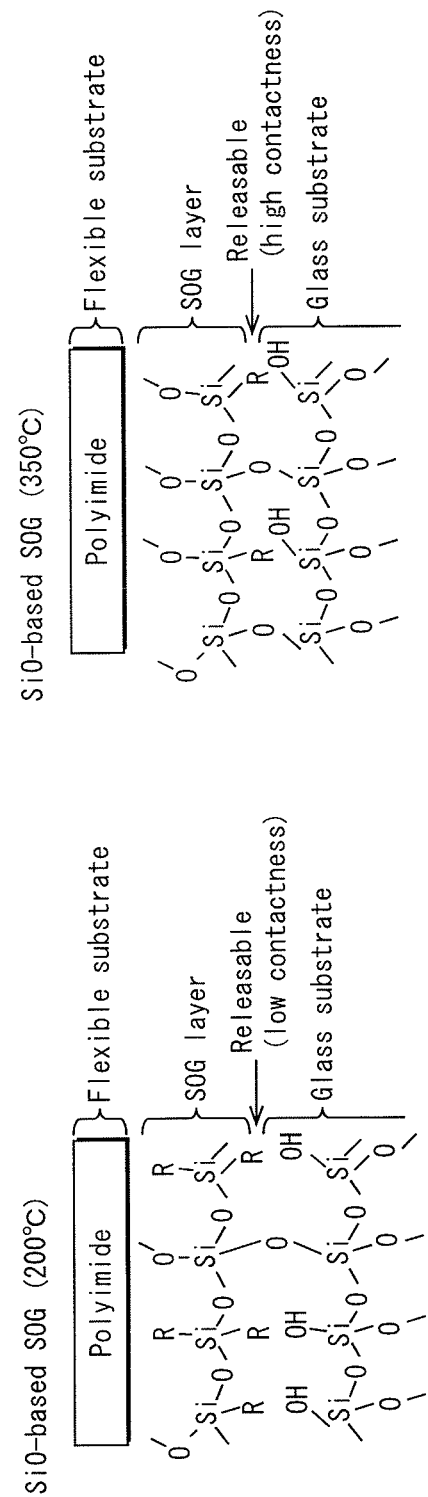
FIGS. 2A and 2B are diagrams used for the explanation of the releasability of a layer that is made of alkylsilane alkoxide derivative.

Outline of One Aspect of Present Invention

A flexible device manufacturing method in one aspect of the present invention comprises: forming a thin film by coating a surface of a support with a predetermined solution in a state where hydroxyl groups are present on the surface; forming a releasing layer by baking the thin film; forming a flexible substrate on the releasing layer; forming a device on the flexible substrate; and releasing the releasing layer, the flexible substrate and the device from the support at an interface between the support and the releasing layer, wherein the predetermined solution contains alkylsilane alkoxide derivative and titanium alkoxide derivative, a baking temperature for baking the thin film in the forming the releasing layer is at least 200° C. and at most 350° C., a ratio of the number of silicon atoms contained in the alkylsilane alkoxide derivative to the number of titanium atoms contained in the titanium alkoxide derivative is in a range from 3.3:1 to 4.1:1 when the baking temperature is at least 200° C. and less than 270° C., the ratio is in a range from 3.3:1 to 23:1 when the baking temperature is at least 270° C. and at most 330° C., and the ratio is in a range from 19:1 to 23:1 when the baking temperature is more than 330° C. and at most 350° C.

According to this aspect of the present invention, a thin film is formed by using a solution that contains alkylsilane alkoxide derivative and titanium alkoxide derivative that are SOG (spin-on-glass) molecules. A releasing layer is then formed by baking the thin film. Subsequently, a flexible substrate is formed on the releasing layer so that the releasing layer is present between the support and the flexible substrate. The releasing layer is formed from the SOG molecules binding with each other. It should be noted here that "SOG molecules binding with each other" means both of derivatives of the same type, such as the above mentioned alkylsilane alkoxide derivative and titanium alkoxide derivative, binding with each other, and derivatives of different types binding with each other.

The alkylsilane alkoxide derivative has releasability from glass and low adhesiveness with glass. The alkylsilane alkoxide derivative is thus considered to contribute to the releasability of the releasing layer. Also, the releasability of the alkylsilane alkoxide derivative changes depending on the baking temperature. More specifically, with the increase of the baking temperature, the releasability becomes lower, and the adhesiveness is caused and becomes higher.

On the other hand, the titanium alkoxide derivative has high adhesiveness with glass and no releasability from glass. The titanium alkoxide derivative is thus considered to contribute to the adhesiveness of the releasing layer. Note that the adhesiveness of the titanium alkoxide derivative does not change with the baking temperature, and the titanium alkoxide derivative has approximately constant adhesiveness regardless of the baking temperature.

As described above, the alkylsilane alkoxide derivative has releasability that changes with the baking temperature. On the other hand, the titanium alkoxide derivative has high adhesiveness with glass that forms the support, and the adhesiveness does not change with the baking temperature.

It is thus possible to obtain a releasing layer having an excellent balance between the adhesiveness with glass and the releasability from glass, by coating the glass with a solvent containing alkylsilane alkoxide derivative, and baking the coated solvent at a temperature controlled to restrict the releasability of the resultant thin film from the glass.

That is to say, in the present aspect of the invention, the adhesiveness and the releasability between the releasing layer and glass are controlled by adjusting (i) a mixture ratio between alkylsilane alkoxide derivative and titanium alkoxide derivative contained in the predetermined solution and (ii) the baking temperature.

More specifically, the adhesiveness and the releasability between the releasing layer of the present aspect and glass are controlled by adjusting (1) a mixture ratio between alkylsilane alkoxide derivative having releasability and titanium alkoxide derivative having adhesiveness and (2) the baking temperature during the formation of the releasing layer.

This makes it possible to obtain a releasing layer having an excellent balance between releasability and adhesiveness with glass by forming the releasing layer with a predetermined mixture ratio of alkylsilane alkoxide derivative and titanium alkoxide derivative and with a predetermined baking temperature range.

In this way, the releasing layer of the present aspect has an excellent balance between releasability and adhesiveness with glass that forms the support, and provides both (i) the adhesiveness required for forming a device and (ii) the releasability required for releasing a flexible substrate from the support. Accordingly, the releasing layer of the present aspect makes it possible to release the releasing layer, flexible substrate and device from the support easily without adding an excessive force or using another means. As a result, it is possible to manufacture a flexible device without fracturing or deforming a flexible substrate, and without breaking the device.

Also, the releasing layer of the present aspect is composed of a single layer that has both releasability and adhesiveness in good balance, and thus there is no need to provide a plurality of layers as the releasing layer. This reduces the load of the process.

Furthermore, since the releasing layer of the present aspect is obtained by baking a film formed from a solution, no vapor-phase process such as vapor deposition is required. This enables the releasing layer to be formed at relatively low cost and easily.

Furthermore, the releasing layer, which is obtained by baking a thin film containing alkylsilane alkoxide derivative and titanium alkoxide derivative, is made of an inorganic material and has heat resistance and dimensional stability, and thus is not deformed or cracked even if it is heated. This further makes it possible to restrict deformation of the flexible substrate which is formed on the releasing layer. Note that the releasing layer after the releasing functions as a barrier film.

In a predetermined situation of the flexible device manufacturing method according to one aspect of the present invention, in the forming the flexible substrate, the flexible substrate is formed on the releasing layer by a coating method. In this structure, a coating method is adopted to form the flexible substrate. This reduces the load of the process for obtaining the flexible substrate.

In another predetermined situation of the flexible device manufacturing method according to one aspect of the present invention, in the forming the flexible substrate, the flexible substrate is formed from polyimide.

In a still another predetermined situation of the flexible device manufacturing method according to one aspect of the present invention, the flexible substrate formed in the forming the flexible substrate has a film thickness of 5 μm to 60 μm. With this structure, the flexible substrate is formed on the releasing layer that has high strength and is difficult to break, and thus the flexible substrate of the present aspect is higher in strength than a flexible substrate under which no such releasing layer is present. Accordingly, the flexible substrate of the present aspect can bear a practical use even when the film thickness thereof is as thin as 5 μm to 60 μm, and can further be made as thin as approximately 5 μm to 20 μm.

In a further predetermined situation of the flexible device manufacturing method according to one aspect of the present invention, the device includes a semiconductor device.

In a further predetermined situation of the flexible device manufacturing method according to one aspect of the present invention, the device includes a display device. In a further predetermined situation of the flexible device manufacturing method according to one aspect of the present invention, the display device is an organic electronic luminescence display device.

A flexible device in another aspect of the present invention is manufactured by the method defined in any of the above-described flexible device manufacturing methods.

A flexible device in a still another aspect of the present invention comprises: a flexible substrate; a releasing layer that is located below the flexible substrate; a semiconductor device that is located above the flexible substrate; and a display device that is located above the flexible substrate and controlled by the semiconductor device, wherein the releasing layer contains polyalkylsiloxane and titanium oxide. According to this structure, when the flexible device is, for example, a bottom-emission-type organic EL display device, the flexible substrate is formed on the releasing layer that contains titanium oxide. With this structure, the titanium oxide absorbs light of the ultraviolet region, among the light from the outside of the flexible device that is an organic EL display device. This reduces the amount of light of the ultraviolet region that enters the inside of the flexible device, thereby reducing the damage made by the light of the ultraviolet region in the organic light-emitting layer contained in the organic EL. It is thus possible to prevent deterioration of the organic light-emitting layer and provide a flexible device having longevity. This structure is particularly suitable for the case where the flexible substrate is made of a material that does not absorb ultraviolet light.

In a predetermined situation of the flexible device according to this aspect of the present invention, a ratio of the number of silicon atoms contained in the polyalkylsiloxane to the number of titanium atoms contained in the titanium oxide is in a range from 3.3:1 to 23:1.

In another predetermined situation of the flexible device according to this aspect of the present invention, the display device is an organic electronic luminescence display device.

[Process by which Present Invention was Achieved]

With regard to a flexible device manufacturing method that comprises forming: a releasing layer on a support; a flexible substrate on the releasing layer; and devices (including a TFT for drive circuit and an organic EL) on the flexible substrate, and releasing the releasing layer, flexible substrate and devices as one unit from the support, the inventors studied the characteristics of the releasing layer that are necessary for the method, as follows.

(1) High Temperature Resistance, Chemical Resistance

First, forming the devices on the flexible substrate includes a high temperature procedure and a procedure using a chemical. For example, in the case where the devices include a TFT for drive circuit, forming the devices includes irradiating laser to a semiconductor layer of the TFT, and performing etching to form a metal wire. To prevent the releasing layer from changing in quality or shape in these procedures, the releasing layer is required to have the high temperature resistance and the chemical resistance.

(2) Adhesiveness, Releasability

Next, when the devices are formed on the flexible substrate, adhesiveness between the releasing layer and the support is required for the flexible substrate to be fixed. On the other hand, when the releasing layer, flexible substrate, and the devices are released as one unit from the support, the releasability between the support and the releasing layer is required for the flexible substrate not to be broken. That is to say, although the adhesiveness and the releasability are chararcteristics that are contrary to each other, the releasing layer needs to have both of the chararcteristics in good balance.

(3) Coatability

Furthermore, to simplify the process and reduce the load of the process, the releasing layer needs to be formed by the coating process when the flexible device is manufactured.

(4) Evaluation of Characteristics

The inventors studied possible materials of the releasing layer having the above characteristics (1) to (3). In that study, an experiment was conducted to evaluate various types of materials on (1) high temperature resistance and chemical resistance, (2) adhesiveness and releasability, and (3) coatability.

In the experiment, an alkali-free glass was used as a glass substrate, and a polyimide was used as the material of a flexible substrate.

As possible materials of the releasing layer, SOG (spin-on-glass) was studied, as well as parylene and COC that are conventionally disclosed in Patent Literature 2 as the possible materials of the releasing layer. In the experiment, alkylsilane alkoxide derivative (manufactured by RASA Industries, LTD.: VRL-1H-5k) which is a SiO-based SOG, and titanium alkoxide derivative (manufactured by RASA Industries, LTD.: TI-204-2k) which is a TiO-based SOG, were used as the SOG.

The releasing layer was formed on the glass substrate by the following method. An SOG solution was coated by a spin coater, heated for one minute at 150° C., heated for one minute at 200° C., and then heated at 330° C.

To form a flexible substrate on the releasing layer, a polyimide precursor was coated by a spin coater, increased in temperature in multiple stages, heated at 350° C. (or 300° C.), and then allowed to cool.

FIG. 1 illustrates results of the experiment. In FIG. 1, sign "○" indicates "evaluated as excellent", sign "x" indicates "evaluated as bad", and sign "Δ" indicates "evaluated as moderate". Upon reviewing the results illustrated in FIG. 1, the inventors came to pay attention to alkylsilane alkoxide derivative, which is SiO-based SOG, and titanium alkoxide derivative, which is TiO-based SOG, since they have enough high-temperature resistance, chemical resistance, and coatability to be used as the material of the releasing layer.

(5) SOG

It is considered that, in SiO-based SOG, silicon (Si), the main metal thereof, has four bonds, and among the four bonds, two bonds are used to bond to adjacent SOG molecules, and the remaining two bonds bond to any of an organic group (OR), a hydroxyl group (OH), and a hydrocarbon group (R).

On the other hand, it is considered that, in TiO-based SOG, titanium (Ti), the main metal thereof, has four bonds, and among the four bonds, two bonds are used to bond to adjacent SOG molecules, and the remaining two bonds bond to any of an organic group (OR) and a hydroxyl group (OH).

It is considered that, in both of SiO-based SOG and TiO-based SOG, dehydration reaction of hydroxyl groups (OH) of SOG molecules with hydroxyl groups (OH) of adjacent SOG molecules or hydroxyl groups (OH) of glass occurs, and this contributes to bonding of SOG molecules to each other or bonding of SOG molecules to glass. Accordingly, when an SOG layer is formed by coating the surface of a glass substrate with SOG and baking it, hydroxyl groups (OH) on the surface of the SOG layer and hydroxyl groups (OH) on the surface of glass are dehydration-condensed and form a covalent bond, which causes adhesiveness between the SOG and the glass. That is to say, the level of the adhesiveness between SOG and glass is determined depending on the amount of hydroxyl groups (OH) that are present on the surface of SOG, and it is possible to control the adhesiveness between SOG and glass by controlling the amount of hydroxyl groups (OH).

On the other hand, in SiO-based SOG among SOGs, a part of bonds of Si bonds to a hydrocarbon group (R). Hydrocarbon groups (R) do not bond to hydroxyl groups (OH) of glass. Thus the SiO-based SOG has releasability from glass.

Upon reviewing the results of the experiment as described above, the inventors had the following insight to the adhesiveness and the releasability of the SiO-based SOG and the TiO-based SOG.

(6) SiO-based SOG

Alkylsilane alkoxide derivative, which is a SiO-based SOG, may be coated on a glass substrate (a support) and baked to form an SOG layer.

Organic groups (OR) contained in alkylsilane alkoxide derivative are hydrolyzed into hydroxyl groups (OH) even with a low-temperature heating during the baking process.

Hydrocarbon groups (R) also leave alkylsilane alkoxide derivative and change into hydroxyl groups (OH) during the baking process, but the level of the change varies depending on the baking temperature.

Hydrocarbon groups (R) do not leave alkylsilane alkoxide derivative nor change into hydroxyl groups (OH) when the baking temperature is less than 200° C. Accordingly, as illustrated in FIG. 2A, at the interface between the SOG layer and the glass substrate, there are hydrocarbon groups (R) bonded to Si atoms on the surface of the SOG layer. The hydrocarbon groups (R) do not bond to hydroxyl groups (OH) on the surface of the glass substrate. Thus the alkylsilane alkoxide derivative has releasability from the glass substrate.

On the other hand, when the baking temperature reaches approximately 200° C., hydrocarbon groups (R) start leaving and changing into hydroxyl groups (OH), and as the baking temperature increases from approximately 200° C., the amount of hydrocarbon groups (R) decreases, while the amount of hydroxyl groups (OH) changed from hydrocarbon groups (R) increases. That is to say, the ratio between hydrocarbon groups (R) and hydroxyl groups (OH) contained in alkylsilane alkoxide derivative is determined from the baking temperature, and the higher the baking temperature is, the larger the amount of hydrocarbon groups (R) that change into hydroxyl groups (OH) is, and the larger the amount of hydroxyl groups (OH) present on the surface of the SOG layer is.

As illustrated in FIG. 2B, the higher the baking temperature is, the higher is the probability that dehydration reaction of hydroxyl groups (OH) of SOG molecules with hydroxyl groups (OH) of adjacent SOG molecules or hydroxyl groups (OH) of glass occurs to form a covalent bond, which lowers releasability and causes adhesiveness between the SOG layer and the glass substrate.

Accordingly, by setting the baking temperature to 200° C. or higher, it is possible to increase the amount of hydroxyl groups (OH) present on the surface of the SOG layer, and as a result of this, control the releasability of the SOG layer from the glass substrate. Note that when the baking temperature of the SOG layer is in a range from 200° C. to 350° C., the SOG layer has releasability from the glass substrate to a certain extent.

(7) TiO-Based SOG

Titanium alkoxide derivative, which is a TiO-based SOG, may be coated on a glass substrate (a support) and baked to form an SOG layer.

Figure 3:
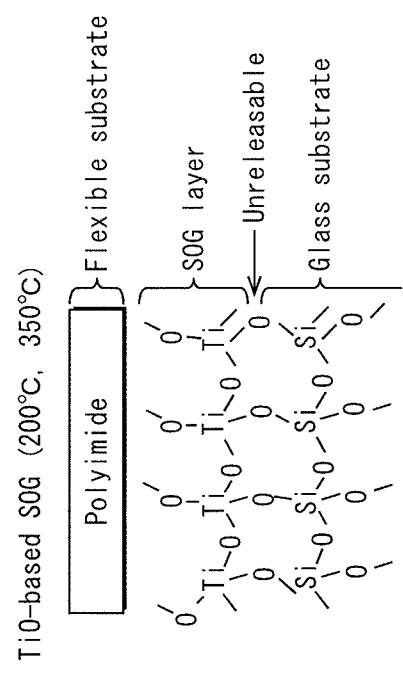
FIG. 3 is a diagram used for the explanation of the releasability of a layer that is made of titanium alkoxide derivative.

As illustrated in FIG. 3, many hydroxyl groups (OH) are present on the surface of the SOG layer that is made of titanium alkoxide derivative that is a TiO-based SOG. For this reason, regardless of the baking temperature, there is a high probability that hydroxyl groups (OH) on the surface of the SOG layer and hydroxyl groups (OH) on the surface of the glass substrate form a covalent bond, and thus adhesiveness between the SOG layer and the glass substrate is caused. That is to say, regardless of the baking temperature, titanium alkoxide derivative has high adhesiveness with glass, but not releasability from glass.

(8) Mixture of SiO-Based Material and TiO-Based Material

As described above, alkylsilane alkoxide derivative has releasability from a support made of glass, and it is possible to control the releasability from glass by controlling the baking temperature. That is say, when the baking is performed at a high temperature, the releasability is lowered, and the adhesiveness is caused. On the other hand, titanium alkoxide derivative has high releasability from a support made of glass regardless of the baking temperature.

In view of this, paying attention to the characteristic of alkylsilane alkoxide derivative that the releasability from glass varies depending on the baking temperature, the inventors made an attempt to obtain a releasing layer having an excellent balance between the adhesiveness with glass and the releasability from glass, by coating the glass surface with a solvent containing alkylsilane alkoxide derivative, and baking the coated solvent at a temperature controlled to control the releasability of the resultant thin film from the glass.

However, only a small amount of alkylsilane alkoxide derivative can be dissolved into the solvent. This is because, if a large amount of alkylsilane alkoxide derivative is dissolved into the solvent, the viscosity of the solvent increases, and if the viscosity is excessively high, a solution process cannot be adopted for forming a thin film. That is to say, there is a limit to the amount of alkylsilane alkoxide derivative that can be dissolved into the solvent, and a solution containing only alkylsilane alkoxide derivative cannot be used for this process.

On the other hand, a large amount of titanium alkoxide derivative can be dissolved into the solvent. In view of this, the inventors made an attempt to obtain a mixture of alkylsilane alkoxide derivative and titanium alkoxide derivative that has an excellent balance between the adhesiveness and the releasability between the releasing layer and glass.

(9) Mixture Ratio and Baking Temperature

To obtain a releasing layer having an appropriate level of adhesiveness and being releasable, the inventors conducted diligent studies on (1) the mixture ratio between alkylsilane alkoxide derivative and titanium alkoxide derivative and (2) the baking temperature range.

In the experiment, a mixed solution of a SiO-based SOG solution (manufactured by RASA Industries, LTD.: VRL-1H-5k) and a TiO-based SOG solution (manufactured by RASA Industries, LTD.: TI-204-2k) was used as a predetermined solution. It should be noted here that alkylsilane alkoxide derivative is contained in the SiO-based SOG solution, and titanium alkoxide derivative is contained in the TiO-based SOG solution.

The ratio between alkylsilane alkoxide derivative and titanium alkoxide derivative contained in the mixed solution was calculated as follows.

First, a SiO-based SOG solution and a TiO-based SOG solution in a desired mixed volume ratio were both heated to evaporate the solvents in the solutions, and then weights of residual solids obtained from the respective solutions were measured. Here, it is considered that, when heated, the alkylsilane alkoxide derivative contained in the SiO-based SOG solution changes to silicon dioxide ($SiO_2$), and the titanium alkoxide derivative contained in the TiO-based SOG solution changes to titanium dioxide ($TiO_2$). Accordingly, the weight of the residual solid obtained from the SiO-based SOG solution was divided by the molecular weight of $SiO_2$, and the weight of the residual solid obtained from the TiO-based SOG solution was divided by the molecular weight of $TiO_2$. In this way, with regard to the SiO-based SOG solution and TiO-based SOG solution in the desired mixed volume ratio, the number of silicon atoms contained in the SiO-based SOG solution and the number of titanium atoms contained in the TiO-based SOG solution were calculated. From these numbers of atoms, a ratio between the number of Si atoms in the alkylsilane alkoxide derivative and the number of Ti atoms in the titanium alkoxide derivative, which are contained in a predetermined solution, is obtained.

Various releasing layers, which are different in the ratio between the number of Si atoms and the number of Ti atoms, were formed, and an experiment was conducted to evaluate the releasability of these releasing layers. FIG. 4 illustrates results of the experiment.

In the experiment, an alkali-free glass was used as the material of a glass substrate. Also, a polyimide was used as the material of a flexible substrate.

Each of the releasing layers was formed by coating a solution by a spin coater, heating for one minute at 150° C., heating for one minute at 200° C., and then baking at 330° C. Note that, in the baking process, the temperature may be increased in multiple stages or may be increased gradually.

To form a flexible substrate on the releasing layer, first, a polyimide was formed by coating a polyimide precursor by a spin coater, and baking it at 350° C. Note that, in this baking, the temperature may be increased in multiple stages or may be increased gradually.

For the evaluation of the releasability of the releasing layer, a cut was made in the flexible substrate and the releasing layer by a knife, and it was checked whether the releasing layer was released naturally. When the whole releasing layer was released by making a cut in a part of the outer circumference, the case was evaluated as "A: easy to release". When the whole releasing layer was released by making a cut in the whole outer circumference, the case was evaluated as "B: having excellent balance between releasability and adhesiveness". When it had high adhesiveness partially and an aggregation breakage occurred to polyimide in the flexible substrate, the case was evaluated as "C: difficult to release".

FIG. 4 illustrates results of the experiment. From the results illustrated in FIG. 4, the suitable ranges of the ratio between the number of Si atoms and the number of Ti atoms (Si:Ti) were determined as follows. That is to say, the suitable range of the ratio is 3.3:1 to 4.1:1, namely, (3.7±0.4):1, when the baking temperature is at least 200° C. and less than 270° C.; 3.3:1 to 23:1, namely, (3.7±0.4):1 to (21±2):1, when the baking temperature is at least 270° C. and at most 330° C.; and 19:1 to 23:1, namely, (21±2):1, when the baking temperature is more than 330° C. and at most 350° C.

(10) Conclusion

Figure 5:
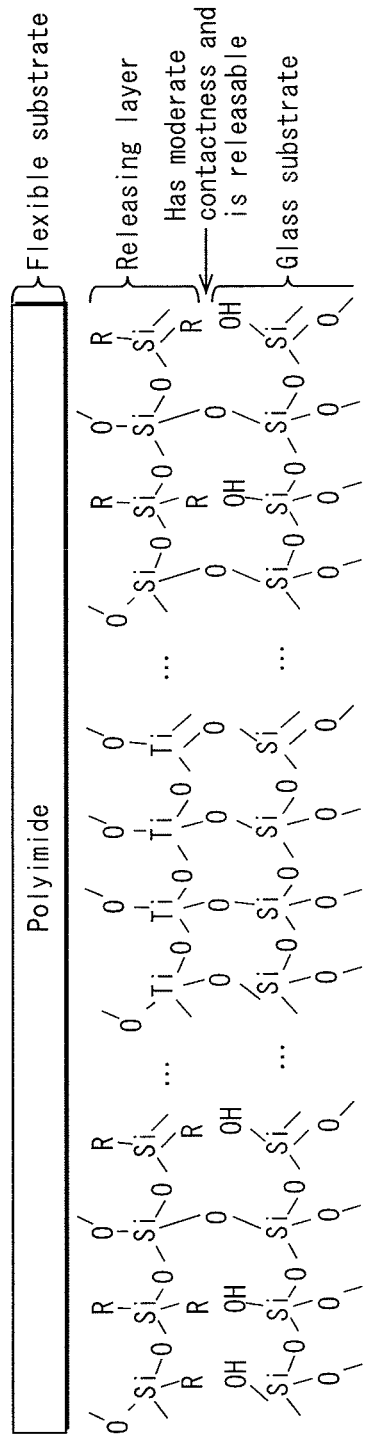
FIG. 5 is a diagram used for the explanation of the releasability of the releasing layer.

By using the above-described knowledge, the inventors succeeded in causing hydroxyl groups (OH) on the surface of the releasing layer and hydroxyl groups (OH) on the surface of the glass substrate to form a covalent bond at a moderate rate as illustrated in FIG. 5, thereby improving the balance between adhesiveness and releasability of the releasing layer with glass, and could obtain a releasing layer that has a moderate adhesiveness and is releasable.

That is to say, according to the present aspect of the invention, the adhesiveness and releasability between the releasing layer and glass are controlled by adjusting the baking temperature while adjusting a mixture ratio of alkylsilane alkoxide derivative and titanium alkoxide derivative contained in a predetermined solution.

This makes it possible to obtain a releasing layer having an excellent balance between releasability and adhesiveness with glass, by forming the releasing layer with a predetermined mixture ratio of alkylsilane alkoxide derivative and titanium alkoxide derivative and with a predetermined baking temperature range.

In this way, the releasing layer of the present aspect has an excellent balance between releasability and adhesiveness with glass that forms the support, and provides both (i) the adhesiveness required for forming a device and (ii) the releasability required for releasing a flexible substrate from the support. Accordingly, the releasing layer of the present aspect makes it possible to release the releasing layer, flexible substrate and device from the support easily without adding an excessive force or using another means. As a result, it is possible to manufacture a flexible device without fracturing or deforming a flexible substrate, and without breaking the device.

Embodiment

The following describes a flexible device manufacturing method and a flexible device in one embodiment of the present invention, with reference to the attached drawings.

Figure 6A:
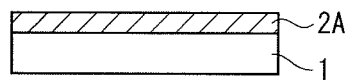
FIGS. 6A to 6E illustrate an outline of the flexible device manufacturing method in one embodiment of the present invention.
Figure 6B:
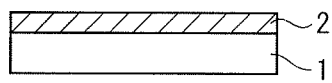
Figure 6C:
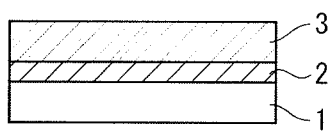
Figure 6D:
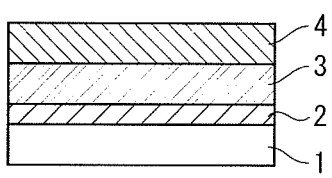
Figure 6E:
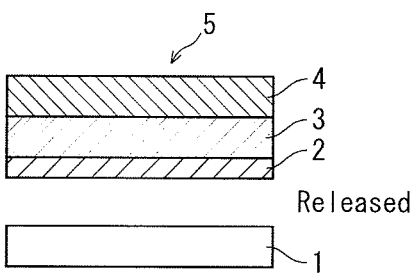

The flexible device manufacturing method in one embodiment of the present invention includes: forming a thin film 2A by coating the surface of a support 1 with a solution, as illustrated in FIG. 6A; forming a releasing layer 2 by baking the thin film 2A, as illustrated in FIG. 6B; forming a flexible substrate 3 made of polyimide resin or the like on the releasing layer 2, as illustrated in FIG. 6C; forming a device 4 on the flexible substrate 3, as illustrated in FIG. 6D; and obtaining a flexible device 5 by releasing the releasing layer 2, flexible substrate 3, and device 4 as one unit from the support 1, as illustrated in FIG. 6E.

The following describes the flexible device manufacturing method in one embodiment of the present invention in detail, and describes the structure of the flexible device in one embodiment of the present invention.

(1) Formation of Releasing Layer

Figure 7:
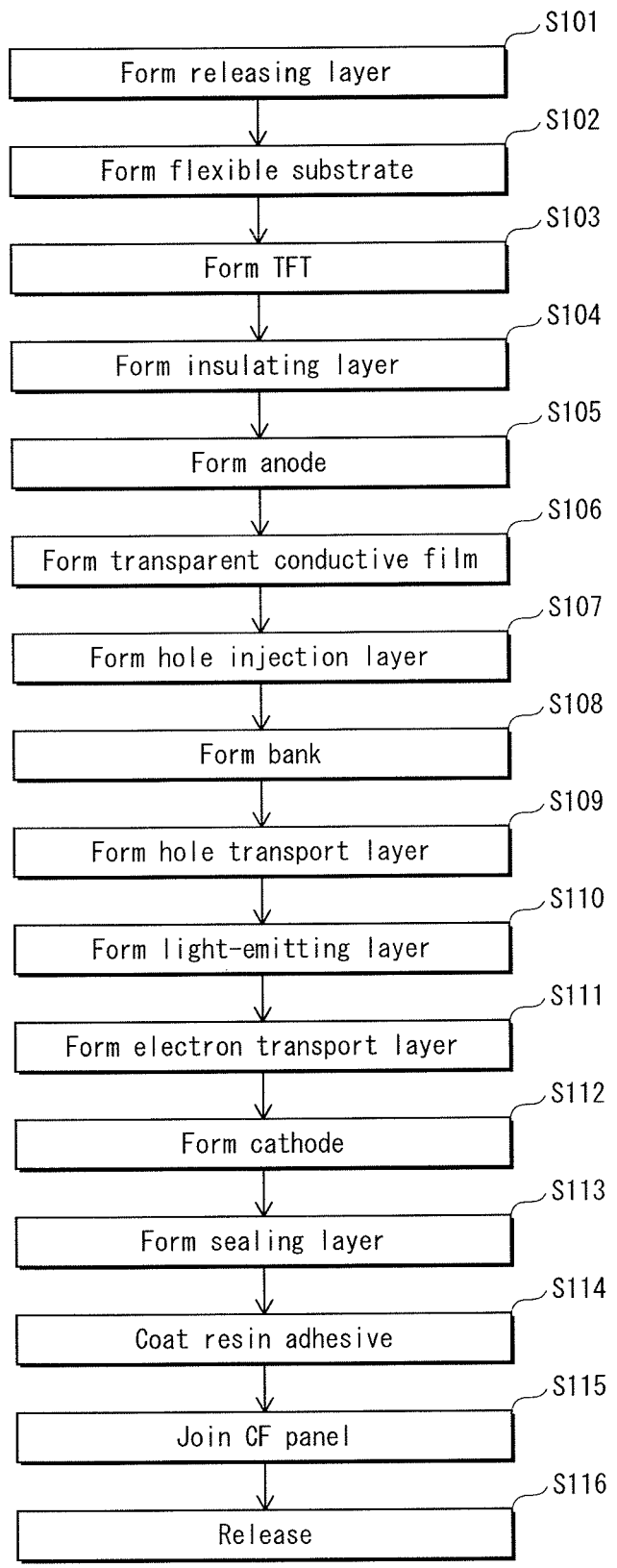
FIG. 7 illustrates details of the flexible device manufacturing method in one embodiment of the present invention.

First, as illustrated in FIG. 7, the releasing layer 2 is formed on the support 1 (S101).

It is desirable that the support 1 has hydroxyl groups on the surface thereof to secure a moderate adhesiveness with the releasing layer 2, that the support 1 has enough high-temperature resistance and chemical resistance to tolerate the device forming process, and that the support 1 has enough rigidity in terms of the handleability. For example, an alkali-free glass substrate that is used in a liquid crystal display device or the like may be used suitably. Other examples of the support having hydroxyl groups on the surface thereof include support substrates such as a quartz substrate, a silicon substrate, and a silicon substrate with a thermal oxidation film. In the following example, an alkali-free glass substrate is used as the support 1.

The releasing layer 2 is used to adjust the adhesiveness between the support 1 and the flexible substrate 3, and is formed by coating the surface of the support 1 with a mixture solution which contains various curable compounds, and hardening the coated solution by baking. As the curable mixture, in particular, a combination of silane alkoxide, which has a relatively low adhesiveness with the glass substrate, and titanium alkoxide, which has a relatively high adhesiveness with the glass substrate, may be used suitably.

The silane alkoxide is represented by the following general formula.

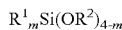

$R^1{}_m Si(OR^2)_{4-m}$

In the above formula, $R^1$ is a 1-6C hydrocarbon group, which may be, for example, a methyl group, an ethyl group, an n-propyl group, an isopropyl group, an n-butyl group, a sec-butyl group, or a tert-butyl group. Also, $R^2$ is a 1-10C hydrocarbon group, which may be, for example, a methyl group, an ethyl group, an n-propyl group, an isopropyl group, an n-butyl group, a sec-butyl group, a tert-butyl group, an n-hexyl group, a cyclohexyl group, an n-octyl group, an n-decyl group, a phenyl group, a vinyl group, or an allyl group. Also note that m is preferably an integer of 0 to 2.

The titanium alkoxide is represented by general formula $Ti(OR)_4$, and may be suitably, for example, titanium tetramethoxide, titanium tetraethoxide, titanium tetra-n-propoxide, titanium tetraisopropoxide, or titanium tetraacetylacetonate.

The forming the thin film 2A by coating the surface of the support 1 with a curable mixture that is to be the releasing layer 2 may be performed by a coating method such as the spin coating method or the slit coating method, or a printing method such as the screen printing. After this, the releasing layer 2 is obtained by drying the thin film 2A for one minute at 150° C., drying it for one minute at 200° C., and finally baking it at a temperature of 200° C. to 350° C. Note that, in the baking process, the temperature may be increased in multiple stages or increased gradually.

(2) Formation of Flexible Substrate

Next, as illustrated in FIG. 7, the flexible substrate 3 is formed on the releasing layer 2 (S102). The base material of the flexible substrate 3 may be, for example, an insulating material such as acrylic resin, styrene resin, polycarbonate resin, epoxy resin, polyethylene, polyester, or silicone resin. For example, a polyimide may be formed by coating a polyimide precursor by a spin coater and baking it. Note that, in this baking, the temperature may be increased in multiple stages or may be increased gradually. The structure of the present embodiment, in which the releasing layer 2, which contains titanium oxide that has an ultraviolet absorbing effect, is formed under the flexible substrate 3, is effective in preventing the organic light-emitting layer from being exposed to ultraviolet light, in particular in the case of a bottom-emission-type flexible device with a flexible substrate 3 that is made of a material that hardly absorbs the ultraviolet light (e.g., silicone resin or polyolefin resin).

According to the present embodiment, the releasing layer 2 is formed under the flexible substrate 3, and thus the flexible substrate 3 is difficult to be broken. This makes it possible to make the flexible substrate 3 thin in film thickness. The film thickness of the flexible substrate 3 is preferably 5 m to 60 μm, and may be approximately 5 μm to 20 μm.

(3) Formation of TFT

Figure 8:
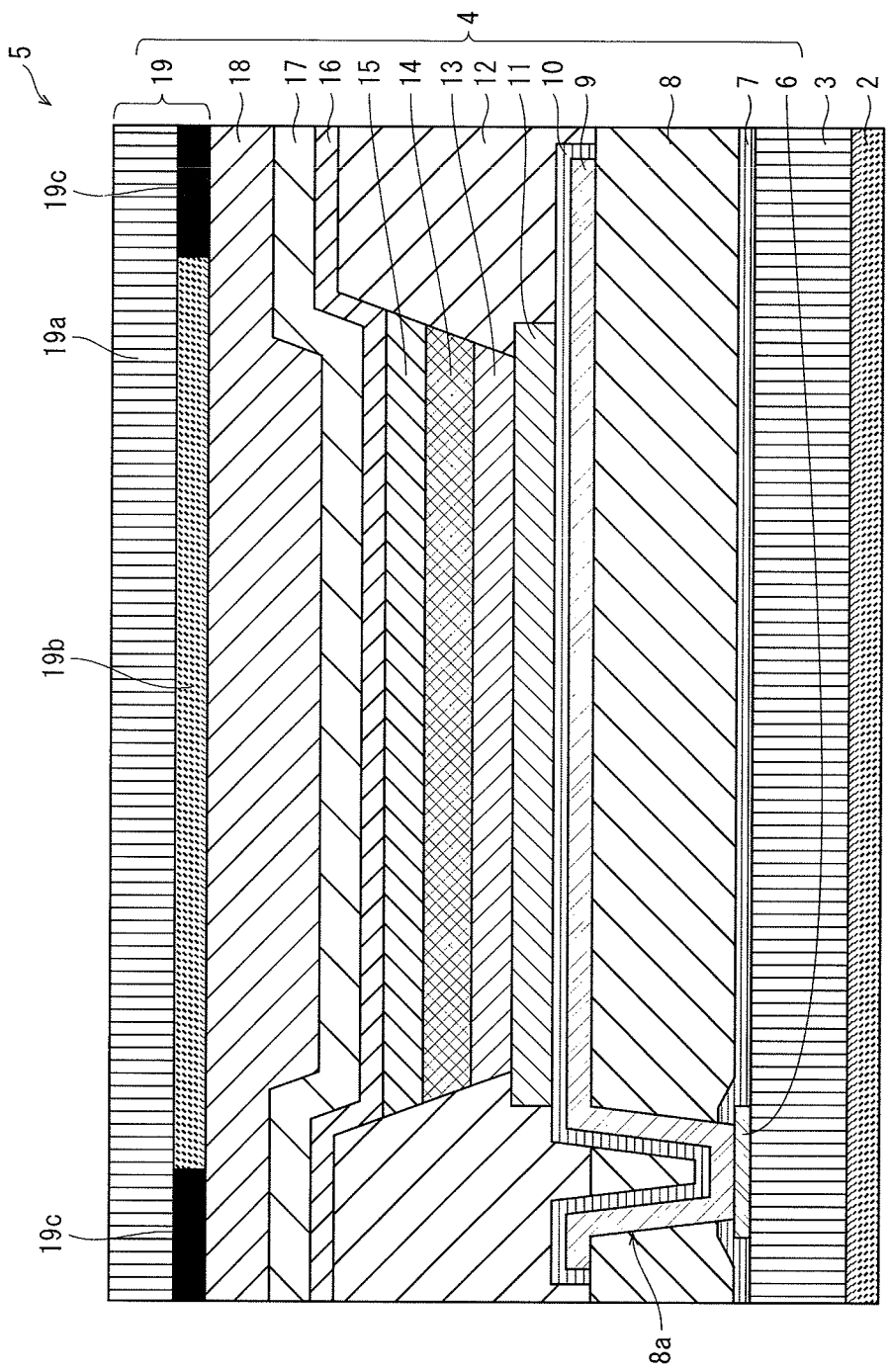
FIG. 8 is a diagram used for the explanation of the laminate structure of the flexible device in one embodiment of the present invention.
Figure 9A:
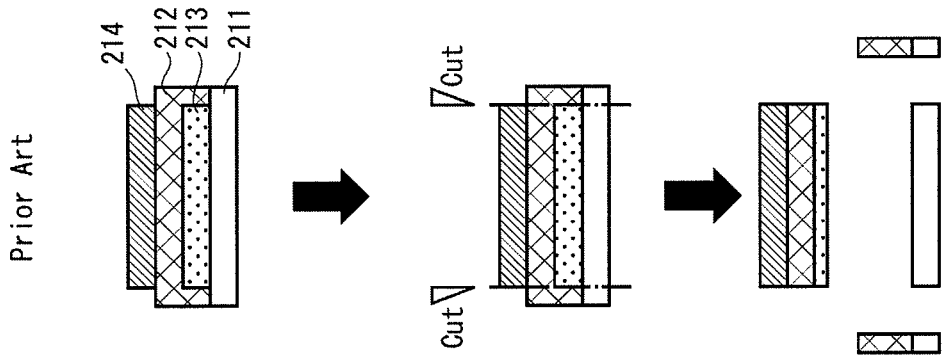
FIGS. 9A and 9B are diagrams used for the explanation of conventional flexible device manufacturing methods.
Figure 9B:
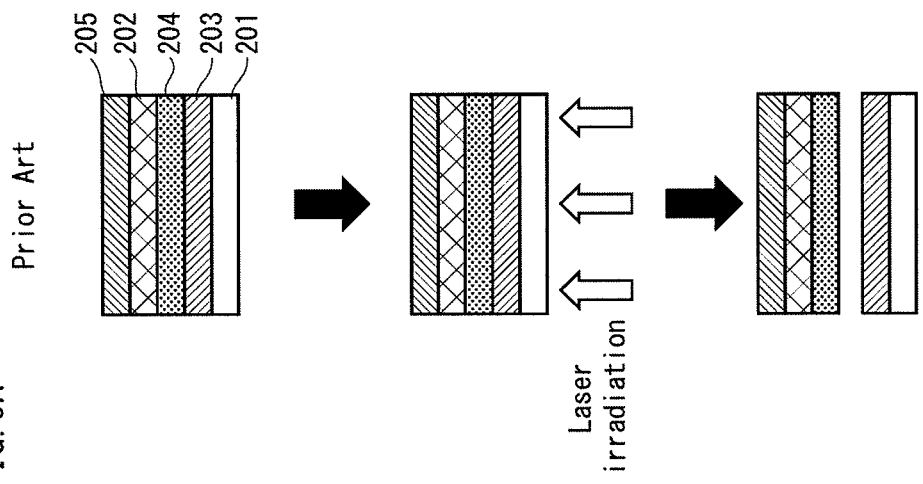

Next, as illustrated in FIG. 7, a TFT is formed as one example of a semiconductor device (S103). As illustrated in FIG. 8, the TFT includes a gate electrode, a source electrode and a drain electrode (in FIG. 8, only the drain electrode, namely, the drain 6, is illustrated) formed on the upper surface of the flexible substrate 3, and is covered with a passivation film 7 thereon. Note that the semiconductor device is not limited to the TFT, but may be, for example, a MOSFET or a CMOS.

(4) Formation of Insulating Layer

Next, as illustrated in FIG. 7, an insulating layer 8 is formed on the TFT (S104). As illustrated in FIG. 8, a contact hole 8a is opened in the insulating layer 8 such that a part of the upper surface of the drain 6 is exposed, and the upper surface of the remaining part of the insulating layer 8 is made approximately flat. The insulating layer 8 is formed by using, for example, an organic compound such as polyimide, polyamide, or acrylic resin.

(5) Formation of Anode

Next, as illustrated in FIG. 7, anodes 9 are formed on the insulating layer 8 (S105). As illustrated in FIG. 8, the anodes 9 are formed in units of light-emitting regions (subpixels), and a part of each anode 9 is curved along the side walls of the contact hole 8a and connected with the drain 6. Note that the anode 9 may be formed by first forming a metal film by the sputtering method or the vacuum deposition method, and then etching the metal film in units of subpixels. The anode 9 is made of, for example, a metal such as Ag or Al. In the case of a top-emission-type flexible device such as the flexible device 5 of the present embodiment, it is preferable that the surface of the anode has high reflectivity.

(6) Formation of Transparent Conductive Film

Subsequently, as illustrated in FIG. 7, transparent conductive films 10 are formed to cover the upper surfaces of the anodes 9 (S106). As illustrated in FIG. 8, each transparent conductive film 10 covers not only the upper surface of the anode 9, but also the side end surfaces of the anode 9, and covers the upper surface of the anode 9 in the contact hole 8a, as well. Note that the transparent conductive films 10, as the anodes 9, may be formed by first forming a film by the sputtering method or the vacuum deposition method and then etching the film in units of subpixels. The transparent conductive films 10 may be made of, for example, ITO (Indium Tin Oxide) or IZO (Indium Zinc Oxide).

(7) Formation of Hole Injection Layer

Next, as illustrated in FIG. 7, a hole injection layer 11 is formed on a part of each transparent conductive film 10 (S107). As illustrated in FIG. 8, the hole injection layer 11 is formed on a part of each transparent conductive film 10. However, not limited to this, the hole injection layer 11 may be formed on the entire upper surface of each transparent conductive film 10.

It should be noted here that the hole injection layer 11 may be made of a metal oxide or an organic material. When a metal oxide is adopted for the hole injection layer 11, the hole injection layer 11 may be formed by, for example, forming a metal oxide film to cover the transparent conductive film 10 and a part of the exposed surface of the insulating layer 8, and then separating the film into subpixels by etching.

The hole injection transporting layer 11 may be made of, for example, an oxide of any of such metals as silver (Ag), molybdenum (Mo), chromium (Cr), vanadium (V), tungsten (W), nickel (Ni), and iridium (Ir), or a conductive polymer material such as PEDOT (a mixture polythiophene and polystyrene sulfonic acid). Among these, the metal oxide as the hole injection layer 11 has a function to inject holes (positive holes) into a light-emitting layer 14 by stabilizing the charge or assisting in the generation of the charge, and has a large work function.

When the hole injection layer 11 is made of an oxide of a transition metal, a plurality of levels can be occupied since there are a plurality of oxidation numbers. This makes hole injection easy and allows for reduction of driving voltage. In particular, use of tungsten oxide ($WO_x$) is desirable since it has a function to inject holes stably and assist in the generation of the holes.

(8) Formation of Bank

As illustrated in FIG. 7, a bank 12 is formed to define the subpixels (S108). As illustrated in FIG. 8, the bank 12 is formed to cover an outer rim portion of each hole injection layer 11, and is formed partial areas of the transparent conductive films 10 and the insulating layer 8 that are not covered by the hole injection layers 11.

To form the bank 12, first, a material layer, which is made of a material of the bank 12, is laminated to cover the hole injection layers 11, the transparent conductive films 10, and the insulating layer 8. The material layer is made of a material that contains, for example, a fluorine-based material or a photosensitive resin material such as acrylic resin, polyimide resin, or novolac-type phenolic resin, and is formed by the spin coat method or the like. Note that, in the present embodiment, a negative photosensitive material (manufactured by ZEON CORPORATION: ZPN1168) may be used, as one example of the photosensitive resin material.

Subsequently, openings corresponding to the subpixels are formed by patterning the material layer. To form the openings, the material layer, with a mask thereon, is exposed to light, and then developed.

The bank 12 is formed by using an organic material, such as resin, and has an insulating property. Examples of the organic material used to form the bank 12 include acrylic resin, polyimide resin, novolac-type phenolic resin, etc. It is preferable that the bank 12 has organic solvent resistance. Furthermore, since the bank 12 may undergo processes such as etching, baking, etc. when formed, it is preferable that the bank 12 be formed from highly resistant material that will not change excessively in shape or quality during such processes. To provide the bank 12 with liquid repellency, the surface thereof may be fluoridated.

(9) Formation of Hole Transport Layer

Next, as illustrated in FIGS. 7 and 8, a hole transport layer 13 is formed in the recess defined by the bank 12 on each hole injection layer 11 (S109 in FIG. 7). The hole transport layer 13 may be formed by forming a film made of an organic compound, which is to be the material of the hole transport layer 13, by the printing method and then baking it. The hole transport layer 13 is formed from a polymer not containing a hydrophilic group. For example, a polymer (e.g., polyfluorene, a derivative of polyfluorene, polyarylamine, or a derivative of polyarylamine) that does not contain a hydrophilic group may be used.

(10) Formation of Light-Emitting Layer

Subsequently, as illustrated in FIGS. 7 and 8, a light-emitting layer 14 is formed on the hole transport layer 13 in each recess defined by the bank 12 (S110 in FIG. 7). The light-emitting layer 14 may be formed by, for example, forming a film made of an organic compound, which is to be the material of the light-emitting layer 14, by the printing method and then baking it. The light-emitting layer 14 has, as described above, a function to emit light when an excitation state is produced by the recombination of injected holes and electrons. The material used to form the light-emitting layer 14 needs to be, for example, a light-emitting organic material, a film of which can be formed by wet printing.

More specifically, it is desirable that the light-emitting layer 14 is formed, for example, from a fluorescent material recited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc.

(11) Formation of Electron Transport Layer

Next, as illustrated in FIGS. 7 and 8, an electron transport layer 15 is formed on the light-emitting layer 14 in each recess defined by the bank 12 (S111 in FIG. 7). The electron transport layer 15 has a function to transport electrons injected from a cathode 16 to the light-emitting layer 14. The electron transport layer 15 is formed from, for example, oxadiazole derivative (OXD), triazole derivative (TAZ), or phenanthroline derivative (BCP, Bphen).

(12) Formation of Cathode

Subsequently, as illustrated in FIG. 7, a cathode 16 is formed on the electron transport layer 15 (S112). As illustrated in FIG. 8, the cathode 16 is formed above the entire flexible substrate 3 to cover the top surface of the bank 12 as well. The cathode 16 may be made of, for example, ITO or IZO. In the case of a top-emission-type flexible device such as the flexible device 5 of the present embodiment, it is preferable that the cathode 16 be made of a light-transmissive material. It is preferable that the light transmissivity be at least 80%.

The cathode 16 may be formed from, as well as any of the above-mentioned materials, for example, an alkali metal, an alkali earth metal, a halide of the alkali metal, or a halide of the alkali earth metal. Also, the cathode 16 may have a laminate structure of an alkali metal layer, an alkali earth metal layer, a layer of a halide of the alkali metal, and a layer of a halide of the alkali earth metal, or a laminate structure of these layers any of which contains silver. The above-described layer that contains silver may be formed from silver alone, or from a silver alloy. Also, in order to increase light extraction efficiency, a highly-transparent refraction index adjustment layer may be provided above the layer that contains silver.

(13) Formation of Sealing Layer

Next, as illustrated in FIG. 7, a sealing layer 17 is formed on the cathode 16 (S113). As illustrated in FIG. 8, the sealing layer 17 is formed on the entire area of the cathode 16 to cover the top surface of the bank 12 as well. The sealing layer 17 has a function to restrict the organic layers, such as the light-emitting layer 14, from being exposed to water or the air, and is formed from, for example, silicon nitride (SiN) or silicon oxynitride (SiON). Furthermore, on a layer formed from SiN, SiON or the like, a sealing resin layer made of a resin material, such as acrylic resin, silicone resin or the like, may be formed.

In the case of a top-emission-type flexible device such as the flexible device 5 of the present embodiment, it is preferable that the sealing layer 17 be made of a light-transmissive material.

(14) Coating Resin Adhesive and Joining CF Panel

Subsequently, as illustrated in FIG. 7, a resin adhesive is coated on the sealing layer 17, and a CF (Color Filter) panel 19, which is prepared in advance, is joined therewith (S114 and S115). As illustrated in FIG. 8, the CF panel 19 joined with a resin adhesive layer 18 includes a substrate 19a, and under the substrate 19a, a color filter 19b and a black matrix 19c.

(15) Releasing

Lastly, as illustrated in FIG. 7, the portion composed of the releasing layer 2 and above is released from the support 1. This completes the flexible device 5 (S116). The flexible device 5 obtained in this way has the releasing layer 2 on the opposite side of the flexible substrate 3 to the side on which the device 4 is formed.

Note that, in the flexible device 5, the TFT including the gate electrode, source electrode and drain electrode (the drain 6), formed on the upper surface of the flexible substrate 3, is a semiconductor device, and the light-emitting element including the anode 9, transparent conductive film 10, hole injection layer 11, hole transport layer 13, light-emitting layer 14, electron transport layer 15, and cathode 16 is an organic EL display device.

INDUSTRIAL APPLICABILITY

The flexible device manufacturing method in one embodiment of the present invention can be used widely in the manufacturing process of a flexible device. Furthermore, the flexible device in one embodiment of the present invention can be used widely in the various fields of, for example, a passive matrix type or active matrix type organic display device and an organic light-emitting device.

REFERENCE SIGNS LIST 1 support
2A thin film
2 releasing layer
3 flexible substrate
4 device
5 flexible device

The invention claimed is:

1. A method of manufacturing a flexible device, comprising:
   forming a thin film by coating a surface of a support with a predetermined solution in a state where hydroxyl groups are present on the surface;
   forming a releasing layer by baking the thin film;
   forming a flexible substrate on the releasing layer;
   forming an operational device on the flexible substrate; and
   releasing the releasing layer, the flexible substrate and the operational device from the support at an interface between the support and the releasing layer to form the flexible device,
   wherein the predetermined solution contains alkylsilane alkoxide derivative and titanium alkoxide derivative,
   a baking temperature for baking the thin film in the forming the releasing layer is at least 200° C. and at most 350° C., a ratio of the number of silicon atoms contained in the alkylsilane alkoxide derivative to the number of titanium atoms contained in the titanium alkoxide derivative is in a range from 3.3:1 to 4.1:1 when the baking temperature is at least 200° C. and less than 270° C., the ratio is in a range from 3.3:1 to 23:1 when the baking temperature is at least 270° C. and at most 330° C., and the ratio is in a range from 19:1 to 23:1 when the baking temperature is more than 330° C. and at most 350° C.

2. The method according to claim 1, wherein in the forming the flexible substrate, the flexible substrate is formed on the releasing layer by a coating method.

3. The method according to claim 1, wherein in the forming the flexible substrate, the flexible substrate is formed from polyimide.

4. The method according to claim 1, wherein the flexible substrate formed in the forming the flexible substrate has a film thickness of 5 μm to 60 μm.

5. The method according to claim 1, wherein the operational device includes a semiconductor device.

6. The method according to claim 1, wherein the operational device includes a display device.

7. The method according to claim 1, wherein the display device is an organic electronic luminescence display device.

8. A flexible device manufactured by the method defined in claim 1.

9. A flexible device, comprising:
a flexible base substrate;
a releasing layer that is located below the flexible base substrate;
a semiconductor device that is located above the flexible base substrate; and
a display device that is located above the flexible base substrate and controlled by the semiconductor device, wherein
the releasing layer contains polyalkylsiloxane and titanium oxide.

10. The flexible device according to claim 9, wherein a ratio of the number of silicon atoms contained in the polyalkylsiloxane to the number of titanium atoms contained in the titanium oxide is in a range from 3.3:1 to 23:1.

11. The flexible device according to claim 9, wherein the display device is an organic electronic luminescence display device.

* * * * *